United States Patent [19]
Tenbrink et al.

[11] Patent Number: 6,028,036
[45] Date of Patent: Feb. 22, 2000

[54] OXIDE CERAMIC SUPERCONDUCTIVE COMPOSITE MEMBER AND METHOD FOR MANUFACTURE

[75] Inventors: Johannes Tenbrink, Moembris; Klaus Heine, Obertshausen; Paul Puniska, Neuberg; Christine Schmitt, Essen, all of Germany

[73] Assignee: Vacuumschmelze GmbH, Hanau, Germany

[21] Appl. No.: 08/150,786

[22] Filed: Nov. 12, 1993

Related U.S. Application Data

[63] Continuation of application No. 07/833,466, Feb. 6, 1992, abandoned.

[30] Foreign Application Priority Data

Feb. 14, 1991 [DE] Germany .......................... P 41 04 421
Apr. 23, 1991 [DE] Germany .......................... P 41 13 220

[51] Int. Cl.$^7$ ............................. H01B 12/00; H01F 6/00; H01L 39/00
[52] U.S. Cl. ........................ 505/237; 505/230; 505/238; 505/239; 505/704; 428/702; 174/125.1
[58] Field of Search ................................. 505/1, 701, 702, 505/703, 704, 237, 238, 239, 220, 230; 428/688, 689, 698, 702; 174/125.1; 29/599

[56] References Cited

U.S. PATENT DOCUMENTS

| | | | |
|---|---|---|---|
| 4,999,336 | 3/1991 | Nadkrani ...................................... | 505/1 |
| 5,017,553 | 5/1991 | Whitlow ...................................... | 505/1 |
| 5,075,285 | 12/1991 | Flükiger ...................................... | 505/1 |
| 5,081,075 | 1/1992 | Jin .............................................. | 505/1 |
| 5,122,507 | 6/1992 | Yamamoto et al. ......................... | 505/1 |

FOREIGN PATENT DOCUMENTS

| | | |
|---|---|---|
| 0 290 331 | 11/1988 | European Pat. Off. . |
| 0412527 | 2/1991 | European Pat. Off. ................... 505/1 |
| 37 31 266 | 4/1989 | Germany . |
| WO88/08618 | 11/1988 | WIPO . |

OTHER PUBLICATIONS

A. Szulczyk and H. Krauth, "Herstellung von $Nb_3Sn$–und $YBa_2Cu_3O_7$–Supraleitern in Drahtform", *Metall*, vol. 43, No. 5, 1989, pp. 418 ff.

*Edelmetall–Taschenbuch*, Degussa Frankfurt am Main, 1967 pp. 91–93.

Metals Handbook, $9^{th}$ Ed. vol. 2, ASM 1982 pp 677.

Geballe, "Paths to Higher Temp. Supercond." Science vol. 259, Mar. 12, 1993 pp 1550–1551.

"Cuprate Superconductors," May 10, 1993, C & EN, pp 4–5.

Engineers Guide to High Tc Superconductivity, Doss, 1989, pp 103–109.

Sahu et al, in Chemistry of High Tc Superconductors II, ACS 1988, pp 1–15.

CRC Handbook, CRC Press, 1984, p D–185.

Jin et al., App. Phys. Letts. 51(Jul. 20, 1987) 203–4.

*Primary Examiner*—William Krynski
*Attorney, Agent, or Firm*—Hill & Simpson

[57] ABSTRACT

A superconductive composite member comprises a core of oxide ceramic superconducting material that is disposed in a metal envelope comprising a silver alloy which is hard-enable by an oxide dispersion. Preferably, the silver alloy is an alloy of Ag—Mg—Ni, Ag—Mn—Ni or Ag—Al alloy which may also include one or more precious metal elements selected from a group consisting of Ru, Rh, Pd, Os, Ir, Pd and Au. The composite member is formed by introducing the superconductive material into the silver alloy envelope, cross section-reducing the assembly of the envelope and core and, subsequently, thermal treatment for the recovery and setting of the oxygen concentration.

2 Claims, 1 Drawing Sheet

OXIDE CERAMIC SUPERCONDUCTIVE COMPOSITE MEMBER AND METHOD FOR MANUFACTURE

CROSS-REFERENCE TO RELATED APPLICATIONS

This is a continuation of application Ser. No. 07/833,466 filed Feb. 6, 1992 and now abandoned.

BACKGROUND OF THE INVENTION

The present invention is directed to a superconductive composite member which is composed of an oxide ceramic superconductive material being surrounded in an outer envelope consisting essentially of a silver alloy hardened by an oxide dispersion in the alloy and to a method of forming the composite member.

Superconductive composite members wherein an oxide ceramic superconductive powder is surrounded by an enveloping material are known, and examples are disclosed in an article by H. Krauth and A. Szulczyk in METALL, Vol. 43, No. 5, (1989), page 418ff. Composite members, such as wires or bands that are also superconductive above the temperature of liquid nitrogen are manufactured by employing an oxide ceramic high-temperature superconductive material (HTSC). The materials suitable for this purpose are known and include among them, for example, phases selected from the systems of YBaCuO, BiSrCaCuO and TlBaCaCuO.

For manufacturing technical conductors, these superconductive powders are filled, for example, into a metal tube. The wire or band is subsequently manufactured by deforming this tube. As a final step, a thermal treatment is implemented that serves the purpose of producing a continuously superconductive connection on the basis of the high-temperature superconductive material and the purpose of optimizing the critical current density. Since the superconductive properties of the oxidic high-temperature superconductors are greatly influenced by the oxygen content, setting the optimum oxygen content should advantageously occur during the final thermal treatment. This means that the oxygen permeation through the enveloping material must be guaranteed. Silver has proven a satisfactory enveloping material. Silver, however, has the disadvantage that it is extremely soft in mechanical terms. Due to the harder core of the oxide ceramic superconductor material, this extremely soft condition will easily lead to a non-uniform deformation of the core during manufacturing the of the composite member. Moreover, silver has a low mechanical strength after the annealings, which anneatings are needed for producing the optimum superconducting properties of the core.

PCT Application WO 88/08618 proposes that a further, outer layer of steel be applied to the composite member. The steel layer, however, decreases the oxygen permeation to such an extent that the composite member was no longer superconductive. It was, therefore, also proposed in this published application to apply a nitrate coat to the silver envelope or to select a sandwich structure having various combinations of material. The manufacture of such a superconductor, however, is complicated and work-intensive, due to the additional required steps for applying the additional enveloping layers.

European Published Application 290 331 discloses that silver alloys can also be employed as enveloping materials instead of silver. AgCu alloys having a copper content between 2.8% and 30% were disclosed in this publication.

Silver alloys, whose melting point lies above the melting point of pure silver, are disclosed in German Published Application 37 31 266 for being used as enveloping materials for superconductive composite members. These materials were intended to enable the implementation of the thermal treatment at temperatures that lie above the melting point of pure silver. Alloys wherein at least one of the elements selected from a group consisting of gold, palladium, platinum, manganese and titanium are alloyed to the silver and are cited as suitable silver alloys.

SUMMARY OF THE INVENTION

It is an object of the present invention to provide a superconductive composite member, whose envelope material, first, has a high oxygen permeation and has mechanical properties which are considerably better than the mechanical properties of pure silver.

In a composite member of this type, the object is achieved in that the oxide-dispersively hardened or, respectively, hardenable silver alloy is employed as the enveloping material.

Dispersion-hardened silver alloys are inherently known and have been utilized, for example, as contact materials in electrical technology. These alloys have improved mechanical values, such as increased hardness and strength compared to silver. In particular, alloys having finely dispersed oxide separation products are suitable. Both the melting temperature, as well as the oxygen permeation, are hardly altered at all, due to the slight alloy additives. The alloying elements contributing to the hardening of the basis of oxide separation should, therefore, be contained in the alloy up to a maximum of 10% by weight but, preferably, in a range of 0.05% to 2% by weight.

Oxide-dispersively hardened or, respectively, hardenable AgMgNi, AgMnNi and AgAl alloys are especially suitable. In the case of AgMgNi alloys, the alloy preferably contains 0.1% through 0.25% Mg by weight, 0.1% through 0.25% Ni by weight, with the remainder being silver. For the AgMnNi alloys, the total content of Mn and Ni should, preferably, amount to approximately 0.5% through 1.5% by weight with the remainder being silver.

For increasing the electrical resistance, a part of the silver can also be, respectively, replaced by at least one of the precious metal elements selected from a group consisting of Ru, Rh, Pd, Os, Ir, Pt and/or Au. The good mechanical properties due to the dispersion hardening are thereby preserved. In order to obtain the high oxygen permeation of the envelope material, the silver content should, preferably, amount to at least 80% by weight. The share of the resistance increasing precious metals should, therefore, not amount to more than 10% by weight. The employment of the precious metal element palladium as an alloy constituent is considered especially advantageous in view of the oxygen permeation.

The hardening occurs by inner oxidation in the inventively employed silver alloys. This can be achieved by a thermal treatment in air or in an atmosphere containing oxygen. Given the AgMgNi alloys, for example, this thermal treatment leads to the dispersion of magnesium oxide particles. The fine dispersion of this hard constituent lends the alloy its high strength. Due to its limited solubility in silver, the nickel part serves the purpose of making the grains finer. The strength of this alloy in the hardened condition is typically twice as high as in the unhardened condition wherein the strength is comparable to that of pure silver. The hardness of the AgMgNi alloys, which is typically 130 HV, is already noticeably higher at room temperature than that of pure silver, which is approximately 80 HV. The difference, however, becomes noticeably greater at elevated temperatures that occur in the manufacturing of the composite member, for example in the thermal deformation or during the thermal treatments. After annealing at 600° C., pure silver has a hardness of only 25 HV, whereas the hardness of the well-oxidized AgMgNi alloy that has already been cited by way of an example remains practically unaltered.

The electrical resistance of the silver alloys essentially corresponds to that of pure silver. Particularly in alternating field applications, an envelope material having a high specific resistance is desirable for reducing losses. As already mentioned, this can be achieved with the addition of at least one of the precious metals Em, which are selected from a group consisting of Ru, Rh, Pd, Os, Ir, Pt, or Au. The values for the specific electrical resistance of the envelope materials of the invention are thereby essentially defined by the specific resistance of the corresponding alloy without the elements that effect the hardening due to the oxide dispersion. The increase in the resistance of binary silver alloys on the basis of precious metal elements Au and Pd is recited, for example, in *Edelmetall-Tachenbuch, Degussa* Frankfurt Am Main 1967, pp. 91–93. It respectively amounts to 0.3 $\mu\Omega$cm per atomic percent of Au or, respectively, Pd in the concentration range from 1–5 atomic percent Au or, respectively, Pd at 20° C. The specific resistance of pure silver amounts to 1.5 $\mu\Omega$cm.

Other advantages and features of the invention will be readily apparent from the following description of the preferred embodiments, the drawings and claims.

DESCRIPTION OF THE PREFERRED EMBODIMENTS

Figure 1:
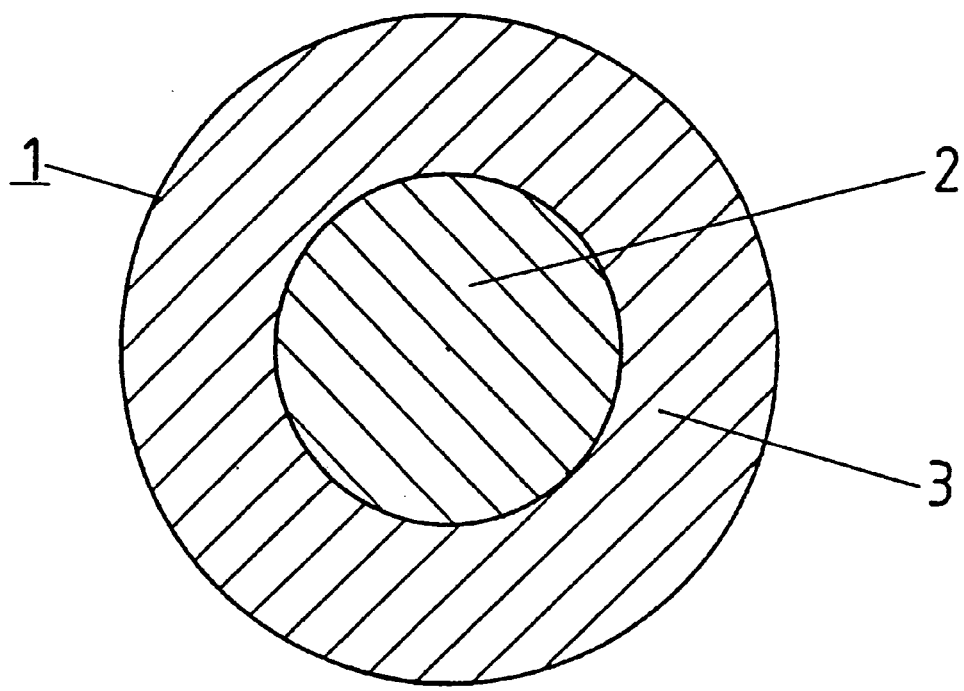
FIG. 1 is a cross sectional view of a superconductive composite member in accordance with the present invention in the form of a wire.
Figure 2:
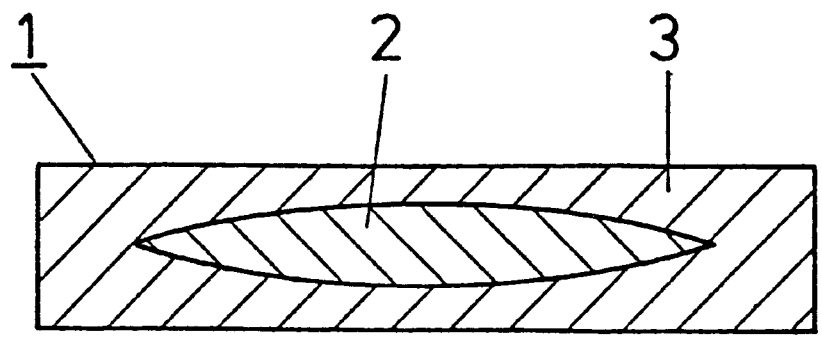
FIG. 2 is a cross sectional view of a superconductive composite member in accordance with the present invention in the form of a band.

The principles of the present invention are particularly useful when incorporated in a composite member 1 illustrated as a band in FIG. 2 and a wire in FIG. 1. The composite member 1 is composed of a core 2 of an oxide superconductive material and is surrounded by an envelope 3 that is formed by a silver alloy hardened or, respectively, hardenable by an oxide dispersion. The composite member 1 can also be fashioned as a multifilament conductor, wherein the multifilament conductor has more cores of the high temperature superconductive material which are arranged in a matrix of the silver alloy that is hardened or hardenable by an oxide dispersion and which matrix acts as a common envelope for the various cores.

The composite member of the invention is manufactured so that the oxide ceramic superconductor material 2 is, first, introduced into the envelope 3, which is composed of a silver alloy that is hardened or, respectively, hardenable by the oxide dispersion. What should be understood by the term of "oxide ceramic superconductor material" are also oxide ceramic materials that only receive their superconductive properties after the implementation of the entire manufacturing process, particularly during a final annealing step. The envelope having the superconductor material contained therein is subsequently subjected to a cross section reducing deformation. What are particularly involved by a cross section reducing deformation are either one or a sequence of the following processes, which include extrusion, hammering, drawing, band rolling, pilger rolling and rolling with rollers, whose axes are oblique to the axis of the article being deformed. Subsequently, a thermal treatment is implemented in an intrinsically known way that, as set forth above, serves the purpose of optimum setting of the superconductive properties. A person skilled in the art is familiar with the conditions for the appropriate annealing treatment.

The hardening of the envelope material by oxide dispersion can already be undertaken before the oxide ceramic material is provided in the tubular envelope. This is especially advantageous when thin bands are to be manufactured in the deformation step, since better deformation properties are established then by a greater hardness of the enveloping material. However, on the other hand, the hardening can occur also after the ultimate dimensions have been achieved and before the final thermal treatment. In this case, the final thermal treatment is preceded by an additional or special annealing that serves the purpose of hardening the envelope material and lends the composite wire greater strength. The hardening can also occur in the intermediate stage as needed.

The tubes or pipes required for the wire manufacture can also be produced by mixing silver powder, fine-grained oxide powder and, potentially, precious metal powder and this mixture is then subsequently further processed into the tube or pipe. The silver/oxide powder mixture is, thus, pressed to form a billet and this, for example, can be reshaped into a tube or pipe by an extrusion process.

In order to achieve a higher density of the superconductive initial material before introduction into the envelope, the oxide ceramic superconductor material can, first, be pre-compressed, in other words before it is introduced into the envelope- This precompression can occur by a cold-isostatic pressing. The compact manufactured in this way can also be additionally sintered. This will result in a further enhancement of the initial density and of the strength of the material. Before the cylinder of superconductive material manufactured in this way is introduced into the envelope, these cylinders must usually first be overwound. A further cold-isostatic pressing of the composite in order to further increase the initial density can occur after the material has been filled into or inserted into the envelope member and can, additionally, occur after the evacuation and closing of the envelope member. The increased initial density leads to a more uniform deformation and, thus, to a better homogeneity of the properties of the superconductive composite member.

Warm-rolling as a cross section-reducing deformation step has particularly proven advantageous for manufacturing the superconductive composite member in the form of a thin band. A significant, more uniform deformation can, therefore, be achieved than in the case of cold-rolling. In cold-rolling, inhomogeneities of the cross section including interruptions in the superconductive material by the envelope materials squeezed therebetween can occur. The reason for the more favorable deformation properties in hot-rolling can be seen wherein that the reduction of the hardness difference due to the softening of the superconductive material occurs as a consequence of an approach to the temperature of partial melting. In the case of $Bi_2Sr_2Ca_1Cu_2O_{8+x}$ (2212-phase), this temperature, for example, lies at approximately 890° C. so that the temperature when hot-rolling the superconductive material preferably lies between 500° C. and 800° C., particularly in a range of between 750° C. and 800° C. For hot-rolling, the temperature of the composite member can be achieved shortly before the nip, particularly by induction heating of a graphite susceptor having a gap for pulling the band therethrough.

In specific exemplary embodiments, superconductive composite members were manufactured wherein the 2212 phase of BiSrCaCuO was utilized as an oxide ceramic superconductor material. The silver alloys Ag—Mg 0.15–Ni 0.15 and Ag—Mg 0.25–Ni 0.25, which contain more than 99% silver, were employed as the envelope materials. The hardness of the Ag—Mg 0.15–Ni 0.15 alloy in the hardened condition lies at 125 HV and the hardness lies at 135 HV in the case of the Ag—Mg 0.25–Ni 0.25 alloy. These values were respectively measured after a 24 hour hardening at 650° C. in air.

Only a moderate decrease in the hardness occurs due to the additional long-term annealing of up to 120 hours at a temperature partially above 900° C. Wires having a diameter of 1 mm were manufactured in a known way from the powder and the envelope material. After the deformation, the area or surface ratio of the Ag alloy envelope to superconductor core lies at approximately 1. The hardening of the AgMgNi alloy occurs after the last deformation step on the basis of a one-hour thermal treatment at 650° C. in air. Subsequently, a known thermal treatment for increasing and setting the oxygen concentration was then implemented. For comparison, superconductive composite members having an envelope of fine silver were also produced. It was shown that the apparent yielding point $R_{p\ 0.1}$ of the composite member of the invention is higher by a factor of 7 to 10, dependent on the Mg content, than in the case wherein the fine silver is utilized. Moreover, the wires of the invention have improved resistance to thermal shock. The E-modulus of the composite wire was identified at approximately 50 GPa. The same critical current density as in the comparison wires was achieved given employment of the envelope materials of the invention up to approximately 1000 A/cm$^2$ (77° K, OT).

Additional obvious developments of the invention are known, per se, to a person skilled in the art. Thus, for example, the composite member can be provided with an insulating coat or a plurality of composite members can be combined to form a multifilament composite member.

Although various minor modifications may be suggested by those versed in the art, it should be understood that we wish to embody within the scope of the patent granted hereon all such modifications as reasonably and properly come within the scope of our contribution to the art.

We claim:

1. A superconductive composite member comprising a core of a copper oxide ceramic superconductor material being received in an outer envelope, said copper oxide ceramic superconductor material being selected from a group consisting of YBaCuO, BiSrCaCuO and TiBaCaCuO, said envelope being an alloy which has a high hardness and has an oxygen permeation, said alloy containing an element forming an oxide dispersion in the alloy to harden the envelope, and at least one additional precious metal for increasing electrical resistance, said precious metal being selected from a group consisting of Ru, Rh, Pd, Os, Ir, Pt and Au, said alloy being an Ag—Mg—Ni—precious metal alloy having 0.1% to 0.25% by weight Mg, 0.1% to 0.25% by weight Ni, no more than 10% by weight precious metal and the remainder being silver.

2. A superconductive composite member comprising a core of a copper oxide ceramic superconductor material being received in an outer envelope, said copper oxide ceramic superconductor material being selected from a group consisting of YBaCuO, BiSrCaCuO and TiBaCaCuO, said envelope being an alloy which has a high hardness and has an oxygen permeation, said alloy containing at least one element forming an oxide dispersion in the alloy to harden the envelope and at least one additional precious metal for increasing electrical resistance, said precious metal being selected from a group consisting of Ru, Rh, Pd, Os, Ir, Pt and Au, said alloy being an Ag—Mn—Ni—precious metal alloy containing Mn and Ni in an overall content of 0.5% to 1.5% by weight, no more than 10% by weight of the precious metal and the remainder of the alloy being silver.

* * * * *